(12) United States Patent
Finn

(10) Patent No.: US 9,661,757 B2
(45) Date of Patent: May 23, 2017

(54) CONNECTING POWER LEADS TO CIRCUIT BOARD

(71) Applicant: Peter Andrew John Finn, North Grafton, MA (US)

(72) Inventor: Peter Andrew John Finn, North Grafton, MA (US)

(73) Assignee: NEC Energy Solutions, Inc., Westborough, MA (US)

( * ) Notice: Subject to any disclaimer, the term of this patent is extended or adjusted under 35 U.S.C. 154(b) by 361 days.

(21) Appl. No.: 14/375,237

(22) PCT Filed: Jan. 29, 2013

(86) PCT No.: PCT/US2013/023544
§ 371 (c)(1),
(2) Date: Jul. 29, 2014

(87) PCT Pub. No.: WO2013/116184
PCT Pub. Date: Aug. 8, 2013

(65) Prior Publication Data
US 2015/0008027 A1 Jan. 8, 2015

Related U.S. Application Data

(60) Provisional application No. 61/592,415, filed on Jan. 30, 2012.

(51) Int. Cl.
*H05K 3/34* (2006.01)
*H01R 12/51* (2011.01)
(Continued)

(52) U.S. Cl.
CPC .............. *H05K 3/34* (2013.01); *H01M 2/204* (2013.01); *H01R 12/51* (2013.01); *H01R 12/58* (2013.01);
(Continued)

(58) Field of Classification Search
CPC ....... H05K 3/34; H05K 3/3421; H05K 3/3426
See application file for complete search history.

(56) References Cited

U.S. PATENT DOCUMENTS

| 5,505,629 A | 4/1996 | Majima et al. |
| 2009/0124099 A1 | 5/2009 | Chen |

(Continued)

FOREIGN PATENT DOCUMENTS

JP 2003323930 11/2003

OTHER PUBLICATIONS

International Search Report PCT/US2013/023544.

*Primary Examiner* — Jeremy C Norris
(74) *Attorney, Agent, or Firm* — Chapin IP Law, LLC

(57) ABSTRACT

An assembler receives a circuit board. The circuit board includes at least a first node and a second node that are adjacent but electrically isolated from each other. There is a gap between the first node and the second node. The first node is electrically isolated from other components on the circuit board. The second node is electrically coupled to circuitry residing on the circuit board. The assembler initiates positioning of a conductive lead of a battery in a vicinity of the first node. The gap between the first node and second node initially prevents the live conductive lead from being in electrical contact with the second node. Eventually, the assembler bridges the gap to provide an electrical connection between at least the conductive lead and the second node to electrically couple the conductive lead to the second node and thus the circuitry residing on the circuit board.

11 Claims, 9 Drawing Sheets

(51) Int. Cl.

| | | |
|---|---|---|
| *H05K 1/18* | (2006.01) | |
| *H01R 12/58* | (2011.01) | |
| *H05K 1/11* | (2006.01) | |
| *H05K 1/14* | (2006.01) | |
| *H05K 3/10* | (2006.01) | |
| *H01M 2/20* | (2006.01) | |

(52) U.S. Cl.
CPC ............ *H05K 1/113* (2013.01); *H05K 1/144* (2013.01); *H05K 1/18* (2013.01); *H05K 3/10* (2013.01); *H05K 3/3426* (2013.01); *H05K 2201/0949* (2013.01); *H05K 2201/09145* (2013.01); *H05K 2201/1034* (2013.01); *H05K 2201/10037* (2013.01); *H05K 2201/10295* (2013.01); *Y10T 29/49155* (2015.01)

(56) References Cited

U.S. PATENT DOCUMENTS

| | | |
|---|---|---|
| 2011/0308856 A1 | 12/2011 | Park et al. |
| 2012/0013307 A1 | 1/2012 | Yamada et al. |

CONNECTING POWER LEADS TO CIRCUIT BOARD

This application is a U.S. National Stage Application, submitted under 35 U.S.C. 371, claiming priority to PCT International Application PCT/US2013/023544 filed on Jan. 29, 2013, which claims the benefit of provisional 61/592,415 filed on Jan. 30, 2012, the entire teachings of which are incorporated herein by this reference.

BACKGROUND

Conventional circuit board assembly processes do not lend themselves to connecting one or more live voltage sources to corresponding nodes on a circuit board. For example, each of multiple live battery leads can be aligned and/or made to loosely contact respective nodes on a circuit board. Subsequent to aligning and/or loosely contacting the one or more battery leads to respective nodes on the circuit board, the battery leads can be soldered to respective nodes to provide a more permanent connection.

One issue associated with the technique of soldering live battery leads to a circuit board is the intermittent (e.g., rapid make and break) connectivity between the battery leads and the nodes on the circuit board. For example, the simultaneous and intermittent connections (e.g., via rapid make and break contacts) between the live battery leads and the different nodes can cause a rapid fluctuation and variation of the magnitudes of voltages applied to the different nodes, resulting in damage to corresponding circuit board components.

BRIEF DESCRIPTION OF EMBODIMENTS

Embodiments herein provide one or more unique ways of providing connectivity between one or more conductive leads and corresponding one or more nodes on a circuit board.

For example, in one embodiment, an assembler receives a circuit board. The circuit board includes at least a first node and a second node that are adjacent but electrically isolated from each other. There is an isolation gap between the first node and the second node. The first node can be electrically isolated from other components on the circuit board. The second node is electrically coupled to circuitry residing on the circuit board.

The assembler initiates contact between a conductive lead of a battery to the first and/or second node on the circuit board. The gap between the first node and the second node initially prevents the conductive lead from being in electrical contact with the second node or other circuitry on the circuit board during assembly. Subsequent to initiating the contact between the conductive lead and the first node, the assembler produces an electrical connection (e.g., low impedance path such as one formed via metallic material) between at least the conductive lead and the second node to electrically couple the conductive lead to the circuitry residing on the circuit board.

By way of a non-limiting example, the assembler applies a suitable material such as a mass of solder to a combination of the first node, the second node, and the conductive lead to electrically connect a combination of the conductive lead and the first node to the second node. The solder and/or any portion of the combination can be heated to facilitate a flow of the solder. In such an embodiment, the heated solder flows across the first node, the second node, and the conductive lead to provide a highly, electrically conductive path (e.g., a low impedance path) between the axial end of the conductive lead, the first node, and the second node.

In accordance with further embodiments, the first node can be a metalized through-hole element disposed on the circuit board. The second node can be and/or include a metallic surface pad. Contacting the conductive lead to the first node can include insertion of an axial end of the conductive lead or any portion of the lead thereof through the through-hole. As mentioned, prior to providing the solder and creating the electrical connection, the gap between the first node and the second node electrically isolates the first node from the second node. Subsequent to applying solder, the solder bridges the gap such that the conductive lead, the first node, and the second node become electrically coupled to each other.

In accordance with an alternative embodiment, note that both the first node and the second node can be metal surface pads. An axial end of the conductive lead contacts the first node. As mentioned, prior to providing the solder, a gap between the first node and the second node electrically isolates the first node from the second node. Subsequent to applying solder, the solder bridges the gap such that the conductive lead and at least the second node become electrically coupled to each other. For example, in one embodiment, the solder produces a connection between the axial end of the conductive lead and the first node; the solder also bridges the gap between the first node and the second node, resulting in coupling of the conductive lead to circuitry disposed on the circuit board. Thus, application of the solder to the first node and/or conductive lead and the second node completes a circuit path and connects the voltage of the conductive lead to the circuitry disposed on the circuit board.

In one embodiment, the conductive lead is coupled to an activated (e.g., "live") voltage source during and after the step of producing the electrical connection. In other words, a live voltage (ground voltage, a voltage greater than ground, a voltage less than ground, etc.) can be applied to the conductive lead before, during, and after the step of providing the solder connection.

Embodiments herein are advantageous over conventional techniques. For example, as mentioned, the first node and second node are spaced by a void, non-conducting gap. Thus, when a conductive lead (e.g., potentially live and being powered by a voltage) is made to contact the first node, there is no damage to the circuitry on the circuit board due to rapid make and break connections between the battery leads and the nodes on the circuit board. By way of a non-limiting example, only after soldering the combination of the first node, second node, and the conductive lead is the conductive lead electrically coupled to the circuit on the circuit board. This controlled technique of coupling and making a connection between the conductive lead and the circuitry reduces a likelihood of damage to the circuitry on the circuit board.

Note further that the step of providing connectivity amongst the conductive leads and/or nodes is shown by way of non-limiting example only and that any suitable method (e.g., welding, brazing, bonding, etc.) can be used to provide the connection.

The width of the gap between the first node and the second node can be any suitable value. In one embodiment, it is desirable that the gap be sufficiently small such that a flow of solder is able to easily bridge the gap and make a connection. By way of a non-limiting example, the gap between the first node and the second node on the circuit board can be a value such as in the range between 0.001 and 0.050 inches (e.g., one thousandth of an inch to 50 thousandths of an inch), although the gap can be of any suitable value outside this range if sufficient solder is applied to bridge the gap.

In one embodiment, the circuit board includes multiple pairings of first and second nodes as discussed above. For example, each pairing can include a respective first node spaced apart by a gap from a respective second node as discussed above. Multiple conductive leads can be coupled to respective first nodes of the pairings. As mentioned, the first nodes are electrically isolated from the circuit components on the circuit board. One or more voltages of the same or different magnitude can be applied to the conductive leads. After making initial contact between the conductive leads and the respective first nodes, an assembler (human or machine) can be configured to produce bridges (e.g., via application of solder) at each of the pairings to connect each of multiple conductive leads to the nodes in the circuit board in an orderly manner. For example, the assembler can be configured to first electrically couple a first conductive lead (such as ground) to circuitry on the circuit board at a first pairing; followed by electrically coupling a second conductive lead (such as 1.5 volts) to the circuitry of the circuit board at a second pairing; followed by electrically coupling a third conductive lead (such as 3.0 volts) to the circuitry on the circuit board; and so on.

These and other more specific embodiments are disclosed in more detail below.

Also, note that this preliminary discussion of embodiments herein purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations, elements, aspects, etc.) of the invention(s), the reader is directed to the textual Detailed Description section and corresponding figures of the present disclosure as further discussed below. The following Detailed Description, in addition to providing an intricate description of details of the invention, also provides a further summary of aspects of the invention or inventions.

BRIEF DESCRIPTION OF THE DRAWINGS

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

Figure 1:
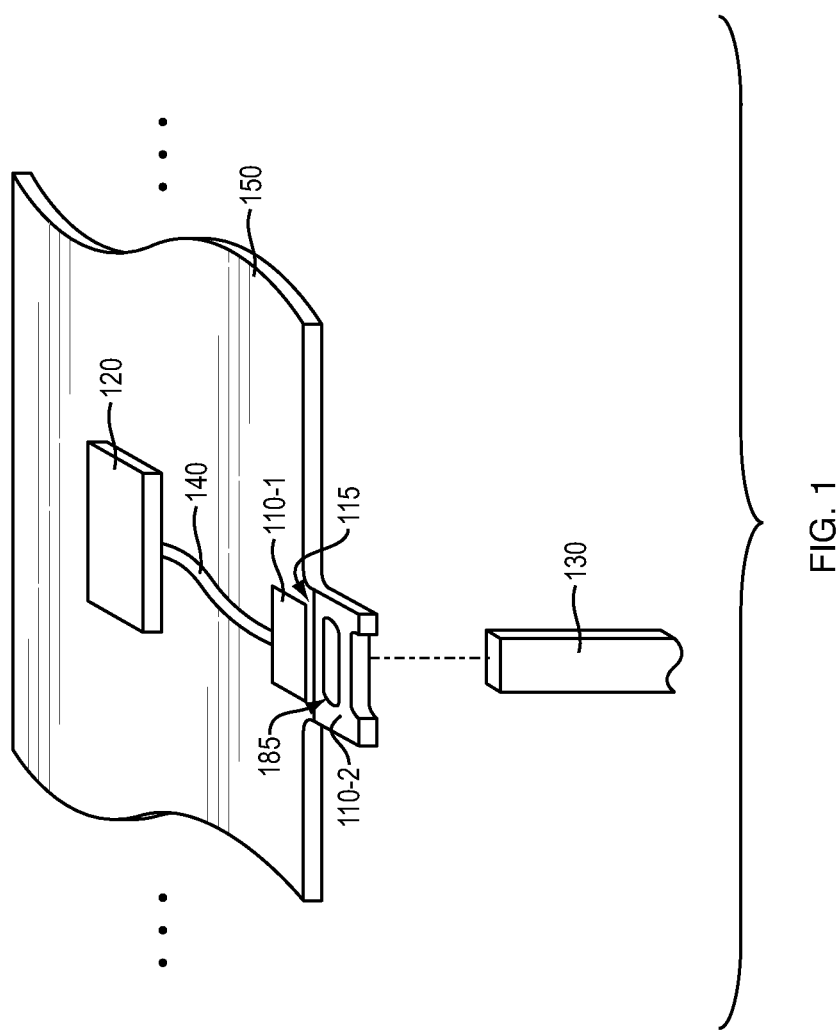
FIG. 1 is an example perspective view of positioning a conductive lead to an isolated node of a circuit board according to embodiments herein.

FIG. 1 is an example perspective view of positioning a conductive lead with respect to a node on a circuit board according to embodiments herein.

As shown, a surface of circuit board 150 includes at least a pair of nodes 110 (e.g., node 110-1 and node 110-2).

In this example, node 110-1 is a through-hole. Node 110-2 can be a surface pad of disposed metal. However, note that node 110-2 can be a metal surface pad as well.

In one embodiment, each of nodes 110 is made from or includes metal such as copper, tin, metal alloy, etc. Metal or other suitable material can be disposed in the through-hole portion of circuit board 150 and one or more surfaces of circuit board 150 as shown.

For example, node 110-2 can include hole 185. Hole 185 can be coated with metal if desired or be void of material on inner surface of hole 185.

Node 110-2 can be or include a layer of metal disposed on a surface of circuit board 150.

In an alternative embodiment, note that nodes such as node 110-2 (and similar nodes) at periphery of circuit board 150 may not include or be coated with any metal material.

Initially, as discussed herein, node 110-2 located at periphery of circuit board 150 is isolated and not coupled to any traces on the circuit board 150.

Conductive path 140 such as one or more traces on or in a layer of circuit board provide connectivity of the node 110-1 to circuitry 120 disposed on the circuit board 150.

Pairing of nodes 110 (e.g., combination of node 110-1 and 110-2) includes a respective gap 115. The gap 115 between node 110-1 and node 110-2 ensures that the node 110-1 and 110-2 are electrically isolated from each other prior to soldering as will be discussed later in this specification.

By way of a non-limiting example, in one embodiment, the gap 115 between node 110-1 and node 110-2 is in a range between 0.00005 and 0.30 inches, although gap 115 can be any suitable value. In one embodiment, the gap is chosen as a value between 0.005 and 0.01 inches.

In one embodiment, the gap 115 is sufficiently small such that hot solder is able to flow and provide connectivity between node 110-1 and node 110-2. In accordance with further embodiments, the gap 115 can be sufficiently small such that hot solder is able to easily flow and provide connectivity between the tip of conductive lead and node 110-2 on circuit board 150.

Node 110-2 can include a hole, barrel, etc., through the circuit board 150 to accept an axial end of conductive lead 130. As mentioned, the hole 185 associated with node 110-2 through circuit board 150 may or may not include conduit material such as a layer of metal material on inner walls.

As further described herein, embodiments herein can include a method comprising: disposing a first node 110-1 and a second node 110-2 on a circuit board 150 to be substantially adjacent to each other as shown. Initially, the first node 110-1 is electrically isolated from the second node 110-2. The first node 110-1 and second node 110-2 are substantially close in proximity to each other to facilitate a connection (e.g., a solder connection) between the first node 110-1 and the second node 110-2.

Figure 2:
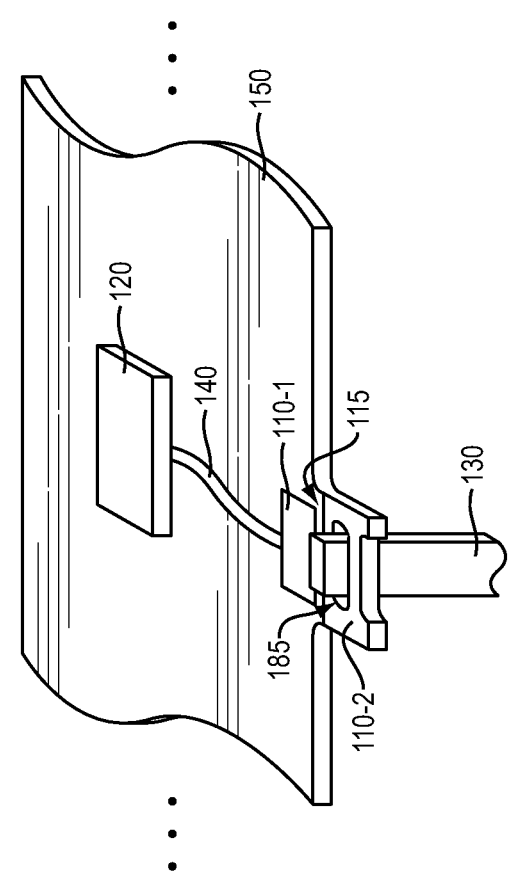
FIG. 2 is an example perspective view of a circuit board and inserting a conductive lead through a node of the circuit board according to embodiments herein.

FIG. 2 is an example perspective view of inserting an axial end of conductive lead 130 (e.g., a wire, tab, metal tape, etc.) through hole 185 of node 110-2 on the circuit board 150 according to embodiments herein.

Figure 3:
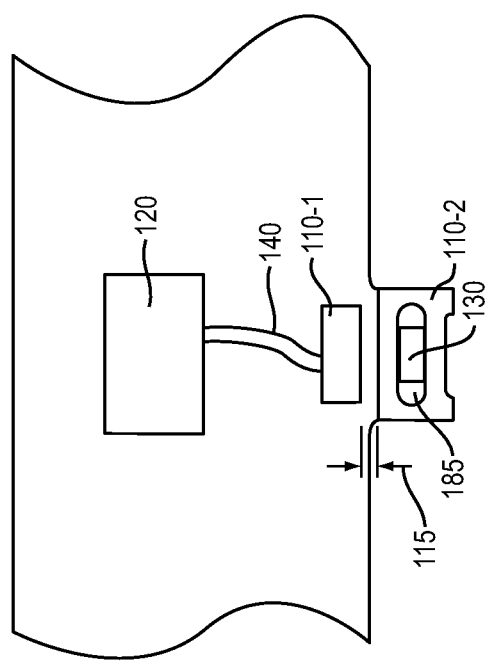
FIG. 3 is an example top view diagram of a circuit board prior to producing a solder bridge according to embodiments herein.

FIG. 3 is an example top view diagram of circuit board 150 and protrusion of axial end of the conductive lead 130 through the hole of node 110-2 prior to producing a solder bridge between node 110-1 and node 110-2 according to embodiments herein.

As mentioned, gap 115 between nodes 110-1 and 110-2 initially provides electrical isolation between node 110-1 and node 110-2. The conductive lead 130 can be coupled to a live battery node. Insertion of the conductive lead 130 into hole 185 of node 110-2 is safe because the node 110-1 and node 110-2 are initially isolated form each other.

Figure 4:
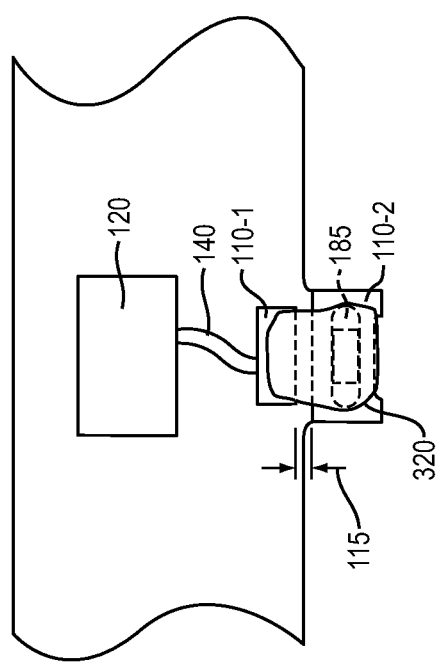
FIG. 4 is an example top view diagram of a circuit board after application of a solder mass according to embodiments herein.

FIG. 4 is an example top view diagram of nodes 110 on circuit board 150 after application of solder to a combination of node 110-1, node 110-2, and axial end of conductive lead 130 according to embodiments herein.

The inclusion of metal material (e.g., a metal surface pad) at or in a vicinity of node 110-2 can be used to facilitate a flow of solder from the tip of conductive lead 130 and the node 110-2. As previously discussed, node 110-2 may not include metal but merely be a hole 185 to accept the end of conductive lead 130.

Embodiments herein can include providing a solder connection between the tip of conductive lead 130 protruding through the hole of the circuit board to the node 110-1. As mentioned, gap 115 (such as a lack or void of metal material) provides electrical isolation of the tip of conductive lead 130 and the node 110-1.

Conductive lead 130 can be coupled to a respective voltage source (e.g., ground, 3 volts, 5 volts, etc.) during a process of applying the solder. In other words, a live voltage can be applied to the conductive lead 130 when the axial end of lead 130 is inserted through the node 110-1. During such insertion, the gap electrically isolates the voltage of the conductive lead 130 from being intermittently applied to the circuit 120, preventing damage to circuit component 120.

Subsequent to heating and applying mass of solder 320 to the combination of node 110-1, node 110-2, and the conductive lead 130 (to which the live voltage is potentially applied) becomes electrically coupled to the circuit 120 via a path including the conductive lead 130, nodes 110, the mass of solder 320, and the conductive path 140.

Figure 5:
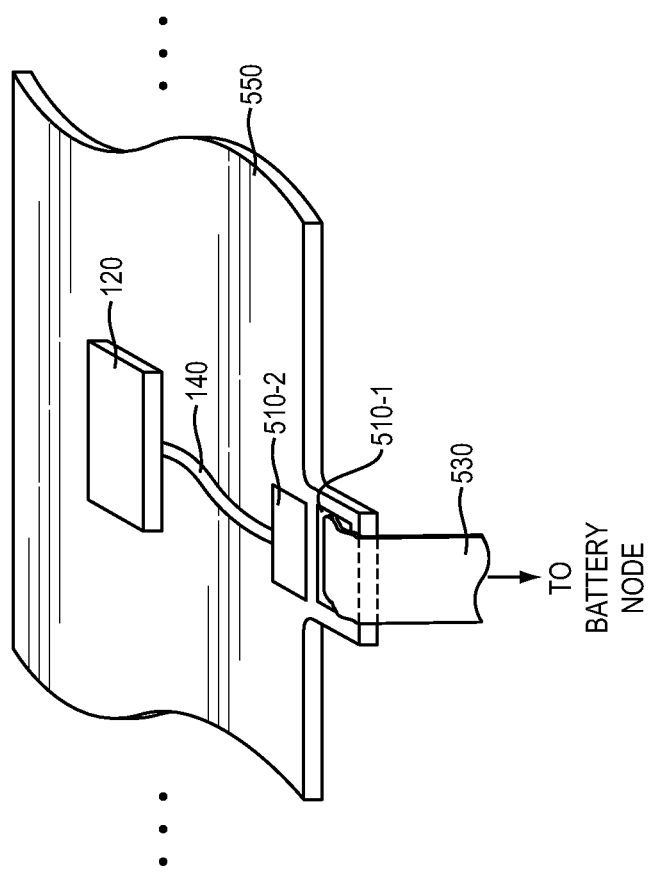
FIG. 5 is an example perspective view diagram illustrating contact of a conductive lead to a node on a circuit board according to embodiments herein.

FIG. 5 is an example perspective view diagram illustrating contact of a conductive lead 530 to a node 510-1 on circuit board 550 according to embodiments herein.

In this example, instead of passing through a hole in node 510-1, the axial end or tip region of the conductive lead 530 is bent around edge of circuit board 150 to provide an initial connection between the tip of conductive lead 530 and node 510-1. In a manner as previously discussed, a mass of solder can be applied to a combination of the axial end of conductive lead 530, node 510-1, and node 510-2 to electrically couple the conductive lead to the conductive path 140 and thus circuit 120.

Figure 6:
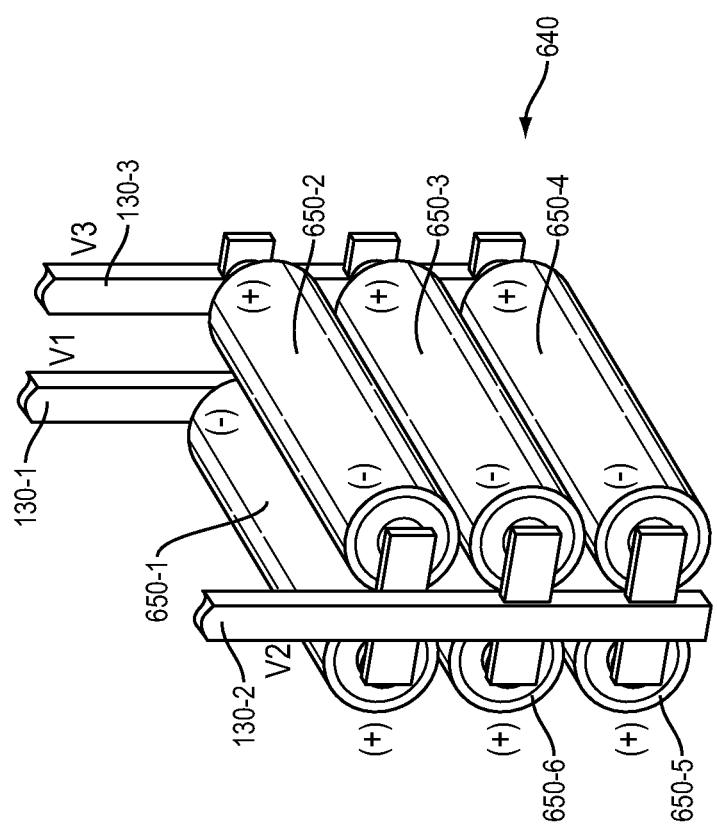
FIG. 6 is an example perspective view diagram illustrating a battery pack and multiple conductive leads according to embodiments herein.

FIG. 6 is an example perspective view diagram illustrating a battery pack 640 and multiple conductive leads 130 according to embodiments herein. As shown, the batteries 650 (e.g., battery 650-1, battery 650-2, battery 650-3, battery 650-4, battery 650-5, battery 650-6, . . . ) can be stacked in parallel and series as shown.

In accordance with one configuration, each of multiple sets of batteries can be connected in parallel. The sets of batteries connected in parallel can be connected in series. The conductive leads 130 (e.g., conductive lead 130-1, conductive lead 130-2, conductive lead 130-3, etc., made from metal such as copper, tin, etc.) can be electrically coupled different node voltages of battery pack 640.

In this non-limiting example embodiment, conductive lead 130-1 is coupled to the negative terminals of batteries 650-1, 650-5, and 650-6. In this example, assume that the voltage at conductive lead 130-1 is V1 or ground.

Conductive lead 130-2 is coupled to the positive terminals of batteries 650-1, 650-5, and 650-6 as well as negative terminals of batteries 650-2, 650-3, and 650-4. By way of a non-limiting example, the voltage at conductive lead 130-2 at voltage V2 can be of magnitude 1.5 volts DC.

Conductive lead 130-3 is coupled to the positive terminals of batteries 650-2, 650-3, and 650-4, and so on. By way of a non-limiting example, the voltage at conductive lead 130-2 at voltage V2 can be of magnitude 3.0 volts DC.

Figure 7:
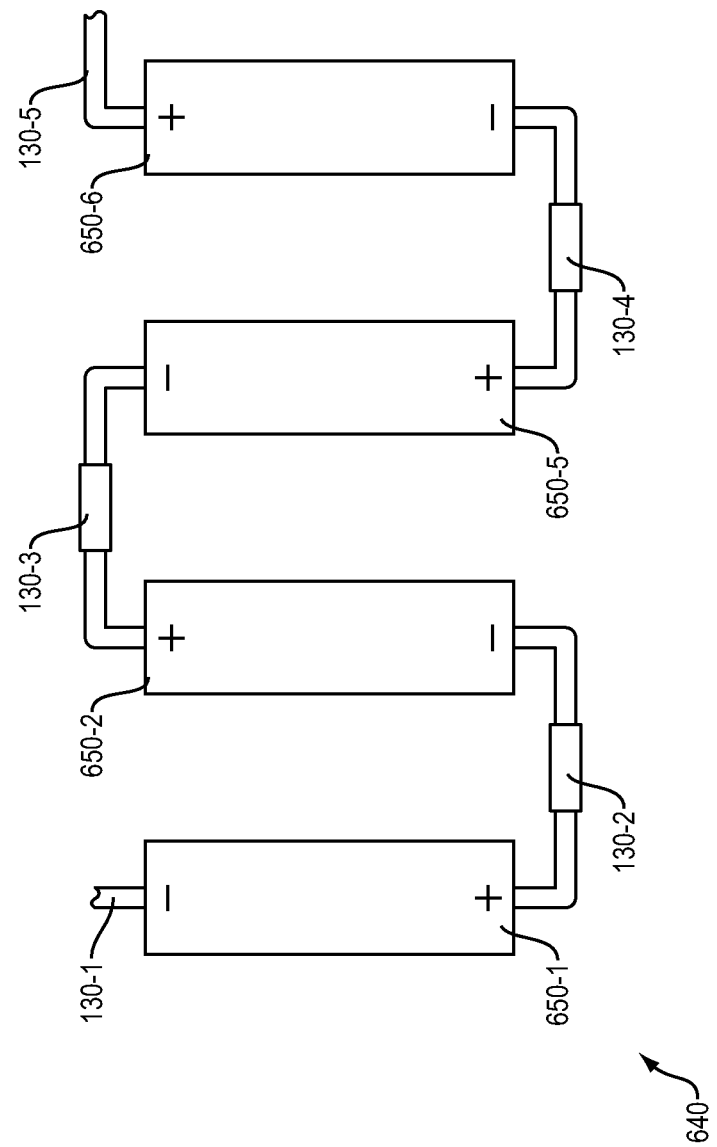
FIG. 7 is an example top view diagram illustrating a battery pack and respective connectivity according to embodiments herein.

FIG. 7 is an example top view diagram illustrating connectivity of batteries 650 in battery pack 640 according to embodiments herein. As previously discussed, the magnitude of voltage (V2) at node 130-2 is greater than the voltage (V1) at conductive lead 130-1; the magnitude of voltage (V3) at node 130-3 is greater than the voltage (V2) at conductive lead 130-2; the magnitude of voltage (V4 or 4.5 volts DC) at node 130-4 is greater than the voltage (V3) at conductive lead 130-3; and so on.

Figure 8:
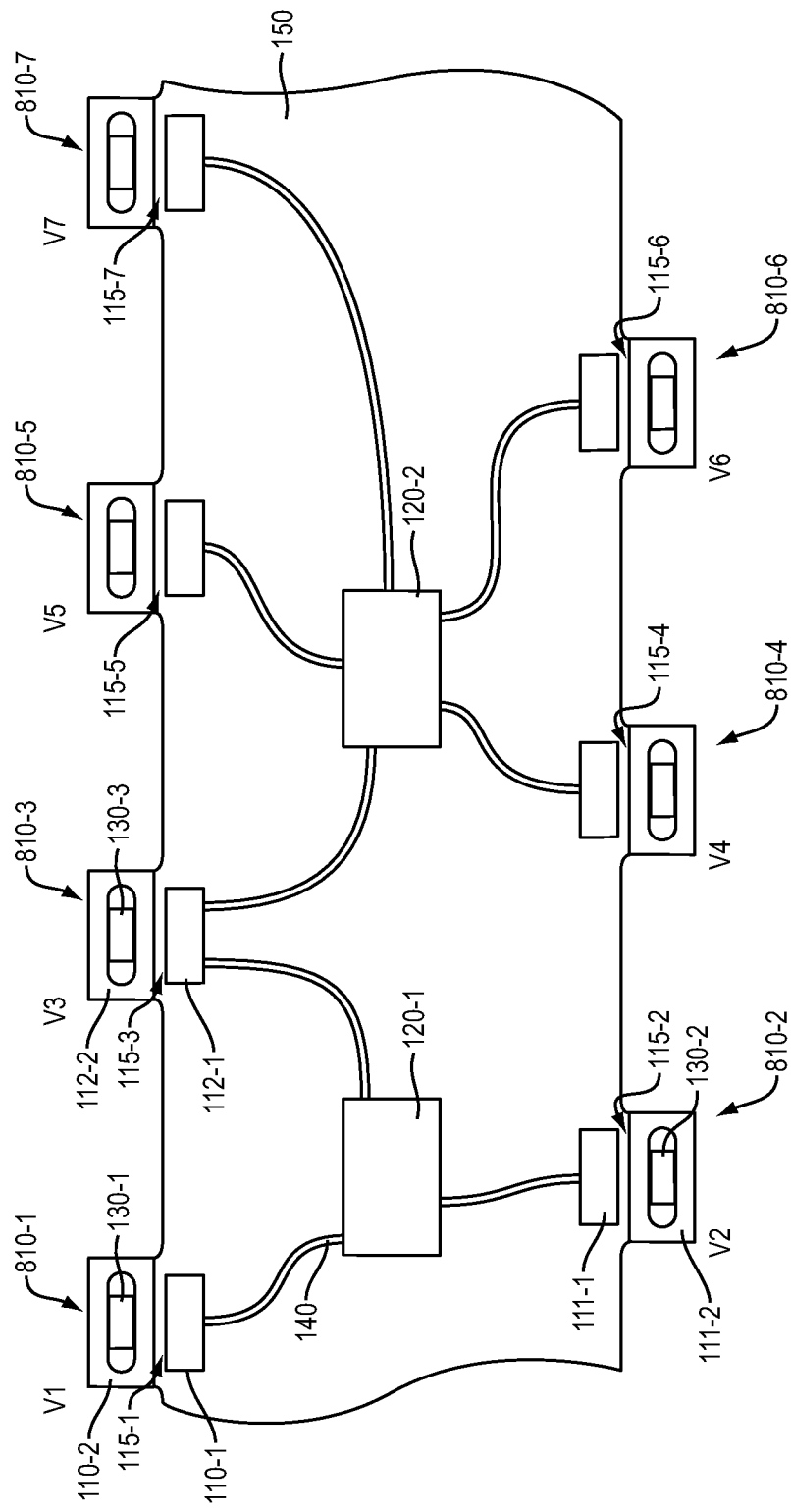
FIG. 8 is an example top view diagram illustrating a circuit board including multiple pairs of spaced nodes according to embodiments herein.

FIG. 8 is an example top view diagram illustrating a circuit board 150 including multiple pairs of spaced node pairs according to embodiments herein.

As previously discussed, each pair can include a respective gap such that the live voltages at respective tips of conductive leads are initially electrically isolated from components on circuit board 150. Node pair 810-1 includes node 110-1 and node 110-2; node pair 810-2 includes node 111-1 and node 111-2; node pair 810-3 includes node 112-1 and node 112-2; and so on.

Circuit board 150 couples to battery pack 640. For example, during assembly, conductive lead 130-1 is inserted through node 110-2; conductive lead 130-2 is inserted through node 111-2; conductive lead 130-3 is inserted through node 112-2; and so on.

As previously discussed, the respective gaps between node pairs on the circuit board 150 prevents the voltages V1 of conductive lead 130-1, V2 of conductive lead 130-2, V3 of conductive lead 130-3, V4 of conductive lead 130-4, . . . from being applied to the circuits 120-1 and 120-2 during assembly.

One embodiment herein includes providing solder and connectivity to the pairings in a predetermined order. For example, embodiments herein include applying solder to node pairing 810-1 to create a connection between node 110-1 and node 110-2, followed by applying solder to node pairing 810-2 to create a connection between node 111-1 and node 111-2, followed by applying solder to node pairing 810-3 to create a connection between node 112-1 and node 112-2, and so on such that respective voltages V1, V2, V3, . . . are applied to the circuits 120-1 in an orderly fashion such as from a lowest magnitude voltage to a highest magnitude voltage.

Gaps 115 provide isolation between respective nodes in a node pairing 810. For example, gap 115-1 includes a void of metal material isolating nodes in node pairing 810-1 (e.g., node 110-1 and node 110-2); gap 115-2 includes a void of metal material isolating nodes in node pairing 810-2 (e.g., node 111-1 and node 111-2); gap 115-3 includes a void of metal material isolating nodes in node pairing 810-3 (e.g., node 112-1 and node 112-2); and so on.

More specifically, by way of a non-limiting example, initially the tips of conductive leads are electrically isolated form components on circuit board 150. The assembler first applies material such as solder to a combination of the tip of conductive lead 130-1, node 110-2, and node 110-1 to electrically connect the conductive lead 130-1 (e.g., a voltage such as V1 or ground) to node 110-1 and circuit 120-1. Thereafter, the assembler applies material such as solder to a combination of the tip of conductive lead 130-2, node 111-2, and node 111-1 to electrically connect the tip of conductive lead 130-2 (e.g., a voltage such as V2) to node 111-1 and circuit 120-1. Thereafter, the assembler applies solder to a combination of the tip of conductive lead 130-3, node 112-2, and node 112-1 to electrically connect the tip of conductive lead 130-3 (e.g., a voltage such as V3) to node 112-1 and circuits 120-1 and 120-2, and so on.

In accordance with another embodiment, the conductive leads 130 can be soldered in any suitable order to nodes 110 to couple batteries to the circuit board 150. A magnitude of each voltage at a respective conductive lead can be any suitable value.

Thus, embodiments herein can include: receiving a circuit board including pairings 810 of nodes. Each of the pairings includes a primary node (e.g., each of nodes 110-2, 111-2, 112-2, etc., is a primary node) and a secondary node (e.g., each of nodes 110-1, 111-1, 112-1, etc., is a secondary node). Each respective primary node in a pair can be disposed adjacent to a respective secondary node in the pair. The respective primary node is electrically isolated from the respective secondary node in the pair.

For each respective pair of the pairings, embodiments herein can include positioning a respective conductive lead of a power source in a vicinity of a corresponding primary node in the respective pair. More specifically, conductive lead 130-1 is disposed in a vicinity of node 110-2; conductive lead 130-2 is disposed in a vicinity of node 111-2; conductive lead 130-3 is disposed in a vicinity of node 112-2; etc.

Embodiments herein can further include: providing electrical connectivity between each of the multiple conductive leads 130 and the secondary nodes, the electrical connectivity completing a conductive circuit path connecting the multiple conductive leads to circuitry disposed on the circuit board. More specifically, conductive lead 130-1 is electrically connected to (secondary) node 110-1; conductive lead 130-2 is electrically connected to (secondary) node 111-1; conductive lead 130-3 is electrically connected to (secondary) node 112-1; and so on.

Positioning of the respective conductive lead of the power source in a vicinity of the corresponding primary node in the respective pair can include inserting the respective conductive lead through the corresponding primary node, the corresponding primary node being a corresponding hole in the circuit board.

Positioning of the respective conductive lead of the power source in a vicinity of the corresponding primary node also can include contacting the respective conductive lead to the corresponding primary node in the respective pair.

Figure 9:
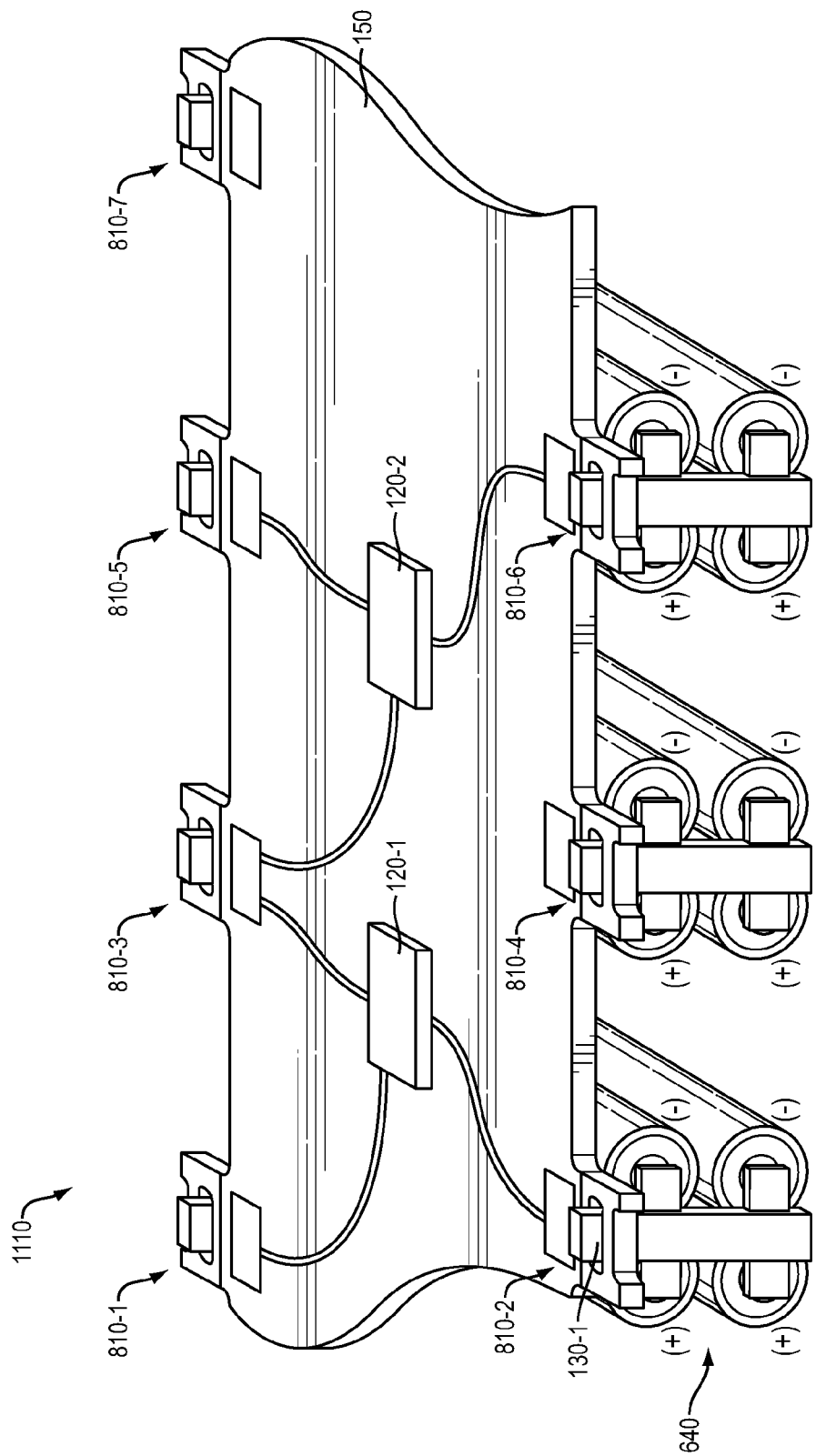
FIG. 9 is an example diagram illustrating a battery system including a circuit board and battery pack according to embodiments herein.

FIG. 9 is an example diagram illustrating connectivity of a circuit board to a battery pack according to embodiments herein.

As shown, battery system 1110 includes a circuit board 150 coupled to a respective battery pack 640. A respective assembler initially slides the conduit leads through the nodes 810 from below the circuit board 150 to above the circuit board (e.g., conductive lead 130-1 is inserted through node 810-1, and so on). As mentioned, the nodes 810 are initially isolated from the components 120 on circuit board 150 to prevent damage. The assembler then solders the respective conductive leads 130 to nodes 110 in any suitable order as discussed above.

Note that, embodiments herein are well suited for use in grid power supply applications, battery pack backup banks, transport applications (e.g., mobile battery backup applications), etc. However, note again that embodiments herein are suitable for any applications in which circuitry is coupled to one or more batteries.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

I claim:

1. A method comprising:
   receiving a circuit board, the circuit board including a first node and a second node that are electrically isolated from each other, the second node electrically coupled to circuitry residing on the circuit board;
   initiating contact of a conductive lead of a battery to the first node; and
   producing an electrical connection between the conductive lead and the second node to electrically couple the conductive lead to the circuitry residing on the circuit board.

2. The method as in claim 1, wherein producing the electrical connection includes:
   applying a mass of solder to a combination of the first node, the second node, and the conductive lead to electrically connect a combination of the conductive lead and the first node to the second node.

3. The method as in claim 1, wherein the first node is a through-hole disposed on the circuit board; and
   wherein initiating contact of the conductive lead to the first node includes inserting the conductive lead through the through-hole.

4. The method as in claim 1, wherein the first node is a first surface pad disposed on the circuit board;
   wherein the second node is a second surface pad disposed on the circuit board; and
   wherein initiating contact of the conductive lead to the first node includes contacting an axial end of the conductive lead to the first surface pad.

5. The method as in claim 4, wherein the conductive lead is a live conductive lead of the battery, wherein the initiating of the contact of the conductive lead to the first node includes initiating the contact of the live conductive lead of the battery to the first node, and wherein the producing of the electrical connection includes producing the electrical connection between the live conductive lead of the battery and the second node to electrically couple the live conductive lead to the circuitry residing on the circuit board.

6. A method comprising:

receiving a circuit board including pairings of nodes, each of the pairings including a primary node and a secondary node, each respective primary node in a pair disposed adjacent to a respective secondary node in the pair, the respective primary node electrically isolated from the respective secondary node in the pair;

for each respective pair of the pairings, positioning a respective conductive lead of a battery in a vicinity of a corresponding primary node in the respective pair; and providing electrical connectivity between each of the multiple conductive leads and the secondary nodes, the electrical connectivity completing a conductive circuit path connecting the multiple conductive leads to circuitry disposed on the circuit board.

7. The method as in claim 6, wherein the positioning of the respective conductive lead of the battery in the vicinity of the corresponding primary node in the respective pair includes:

inserting the respective conductive lead through the corresponding primary node, the corresponding primary node being a corresponding hole in the circuit board.

8. The method as in claim 6 further comprising:

contacting the respective conductive lead to the corresponding primary node in the respective pair.

9. The method as in claim 6, wherein providing the electrical connectivity includes providing a respective solder connection between each of the multiple conductive leads and corresponding secondary nodes.

10. The method as in claim 6 further comprising:

providing the electrical connectivity between each of the multiple conductive leads and corresponding secondary nodes in a pre-specified order.

11. The method as in claim 10, wherein the multiple conductive leads supply different magnitudes of live voltages to the circuit board.

\* \* \* \* \*